(12) United States Patent
Feng et al.

(10) Patent No.: US 6,215,362 B1
(45) Date of Patent: Apr. 10, 2001

(54) PHASE-LOCKED LOOP (PLL) FOR RADIO-FREQUENCY (RF) SIGNALS

(75) Inventors: Shen Feng, San Diego, CA (US); Edmund Götz, Dachau (DE)

(73) Assignee: Siemens Aktiengesellscaft, Munich (DE)

( * ) Notice: Subject to any disclaimer, the term of this patent is extended or adjusted under 35 U.S.C. 154(b) by 0 days.

(21) Appl. No.: 09/327,011

(22) Filed: Jun. 7, 1999

(30) Foreign Application Priority Data

Jun. 5, 1998 (DE) .............................................. 198 25 215

(51) Int. Cl.$^7$ ....................................................... H03L 7/089
(52) U.S. Cl. .............................. 331/17; 331/16; 327/536; 327/156; 327/157
(58) Field of Search ................................ 331/16, 17, 1 A; 327/536, 156, 157

(56) References Cited

U.S. PATENT DOCUMENTS

| | | | |
|---|---|---|---|
| 4,562,411 | 12/1985 | O'Rourke et al. | 331/1 A |
| 5,164,889 | 11/1992 | Ruetz | 331/1 A |
| 5,220,294 | 6/1993 | Ichikawa | 331/17 |

*Primary Examiner*—Arnold Kinkead
(74) *Attorney, Agent, or Firm*—Herbert L. Lerner; Laurence A. Greenberg; Werner H. Stemer

(57) ABSTRACT

In a PLL circuit, the precharging function necessary for setting a required initial state of a VCO is achieved by an additional precharge pump inserted in parallel with the charge pump, or alternatively by multiplexers and inverters implemented directly with the charge pump. The precharging function being controlled in both cases by two control signals. PLL circuits according to the invention are applied, in particular, in integrated circuits of mobile transceivers, for example for GSM, PCN and PCS.

11 Claims, 3 Drawing Sheets

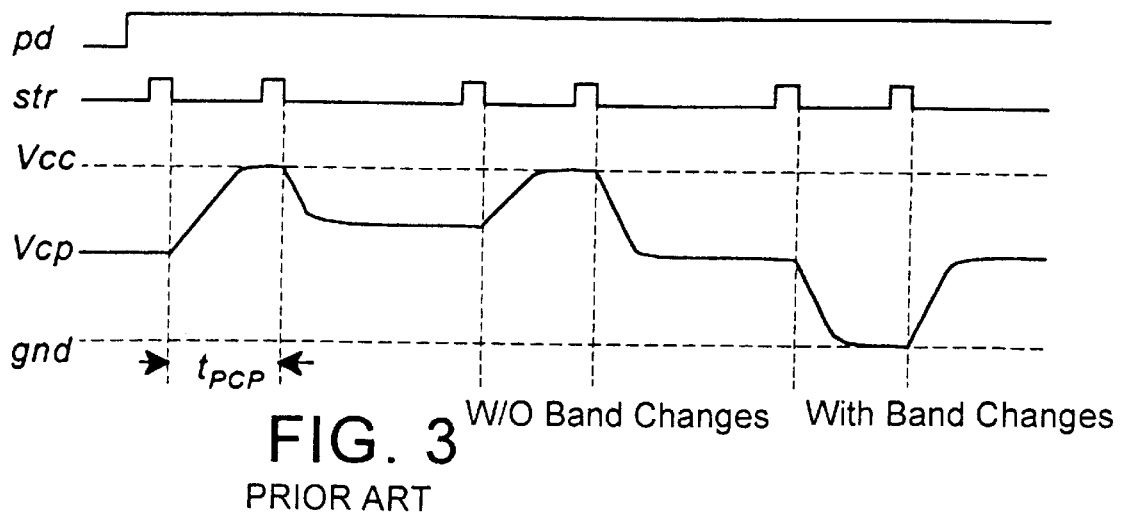
FIG. 3 W/O Band Changes   With Band Changes
PRIOR ART
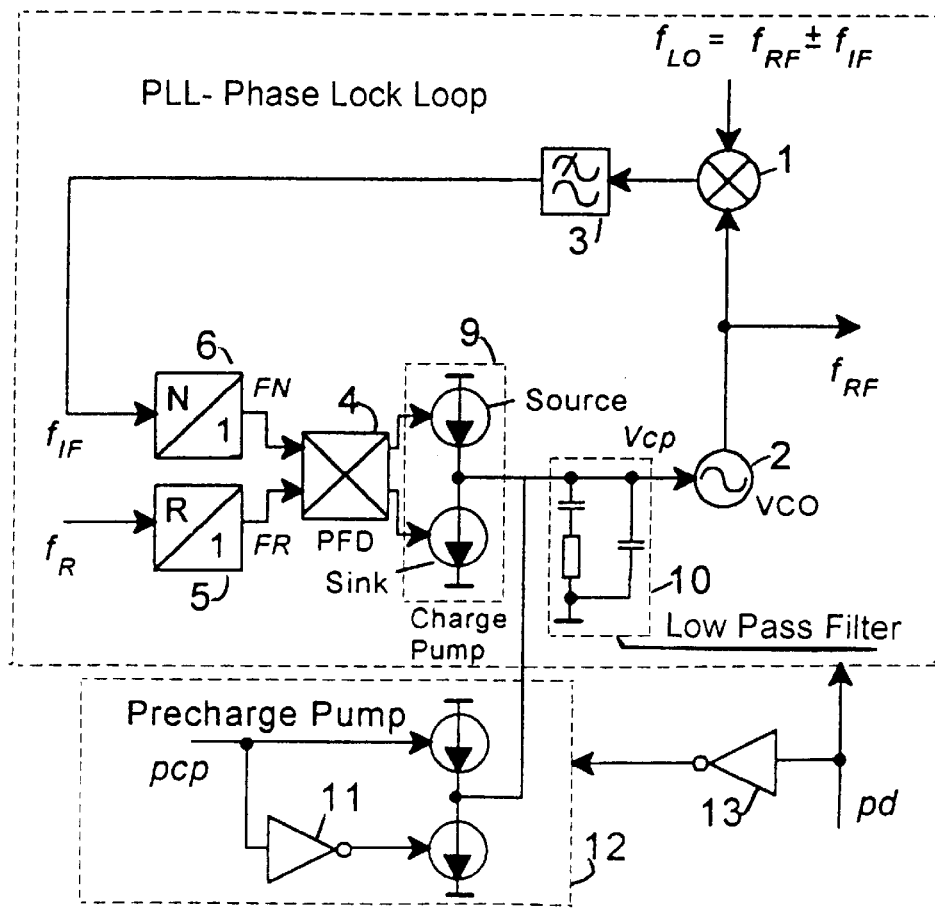
FIG. 4

PHASE-LOCKED LOOP (PLL) FOR RADIO-FREQUENCY (RF) SIGNALS

BACKGROUND OF THE INVENTION

Field of the Invention

The invention relates to a phase-locked loop (PLL) for radio-frequency (RF) signals. Phase-lock loops of this type generally have a voltage-controlled oscillator outputting a signal received by a loop mixer. The loop mixer in turn outputs a signal received by a phase frequency detector (PFD). The PFD also receives a further input signal and outputs signals received by a charge pump. In turn, the charge pump outputs signals controlling the voltage-controlled oscillator.

Various RF circuits which can be implemented as integrated circuits (ICs) using present day semiconductor technologies and have a phase-locked loop (PLL) have been developed for telecommunication systems. In general, these systems have a PLL frequency synthesizer with a loop mixer (MPLL) or an upconversion modulation loop transmitter (UML-TX) with a local signal and a reference signal generated by an oscillator or frequency synthesizer. In these systems precharging is achieved by software programming, the term "software precharging" is used for this. The solution of software precharging has the following disadvantages:

1) there is a high power consumption in the case of precharging, because the R/1 and N/1 dividers, a phase-frequency detector and a charge pump must be switched on;
2) in a time frame and time slots of TDMA (Time Division Multiple Access) cellular systems such as, for example, GSM or PCN, in which the time frame (4.616 ms) is divided into 8 time slots (577 $\mu$s), critical timing of drive signals for the PLLs arises, because the circuits are switched on by software using two separate programming operations (precharging and active); and
3) precharging is required both for single-band and for dual-band applications without band changing, because the PLLs have a non-defined voltage when switched off, depending on the output frequency of the voltage-controlled oscillator (VCO).

SUMMARY OF THE INVENTION

It is accordingly an object of the invention to provide a phase-locked loop (PLL) for radio-frequency (RF) signals which overcomes the above-mentioned disadvantages of the prior art devices of this general type.

With the foregoing and other objects in view there is provided, in accordance with the invention, a phase-locked loop for radio-frequency signals, including:

a voltage controlled oscillator generating an output signal;

a loop mixer receiving and mixing the output signal from the voltage controlled oscillator with a local oscillator signal and outputting a mixed signal;

a phase-frequency detector receiving a reference signal and the mixed signal, and outputting charge pump signals;

a charge pump circuit generating a control voltage and containing a charge pump receiving the charge pump signals from the phase-frequency detector and a precharge pump supplementing the charge pump, the precharge pump receiving and driven by logic control signals including a first logic control signal and a second logic control signal, the first logic control signal ensuring during precharging that the phase-locked loop is in a standby mode and that only the precharge pump is in an active mode, and, conversely, after the precharging the phase-locked loop is in an active mode and the precharge pump is in a standby mode, and the second logic control signal ensuring that the precharge pump applies the control voltage required for setting an initial state of the voltage-controlled oscillator to allow a fast lock-in of the voltage-controlled oscillator during a settling phase; and a passive loop low-pass filter receiving the control voltage and outputting a filtered control voltage received by and controlling the voltage-control oscillator.

It is an object of the invention to specify for PLLs possibilities for carrying out precharging which manage with a low power consumption during precharging and exhibit noncritical timing for precharging, and in the case of which the programming operation for precharging is eliminated for single-band and dual-band applications, with the result that the PLLs can be switched on faster.

The PLLs configured according to the invention are advantageously constructed using integrated circuit (IC) technology.

Other features which are considered as characteristic for the invention are set forth in the appended claims.

Although the invention is illustrated and described herein as embodied in a phase-locked loop (PLL) for radio-frequency (RF) signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a graph of a timing diagram for software precharging in the case of the known circuits according to FIGS. 1 and 2;

FIG. 4 is a circuit block diagram of the PLL frequency synthesizer with the loop mixer (MPLL) and a precharge pump according to the invention;

DESCRIPTION OF THE PREFERRED EMBODIMENT

Figure 1:
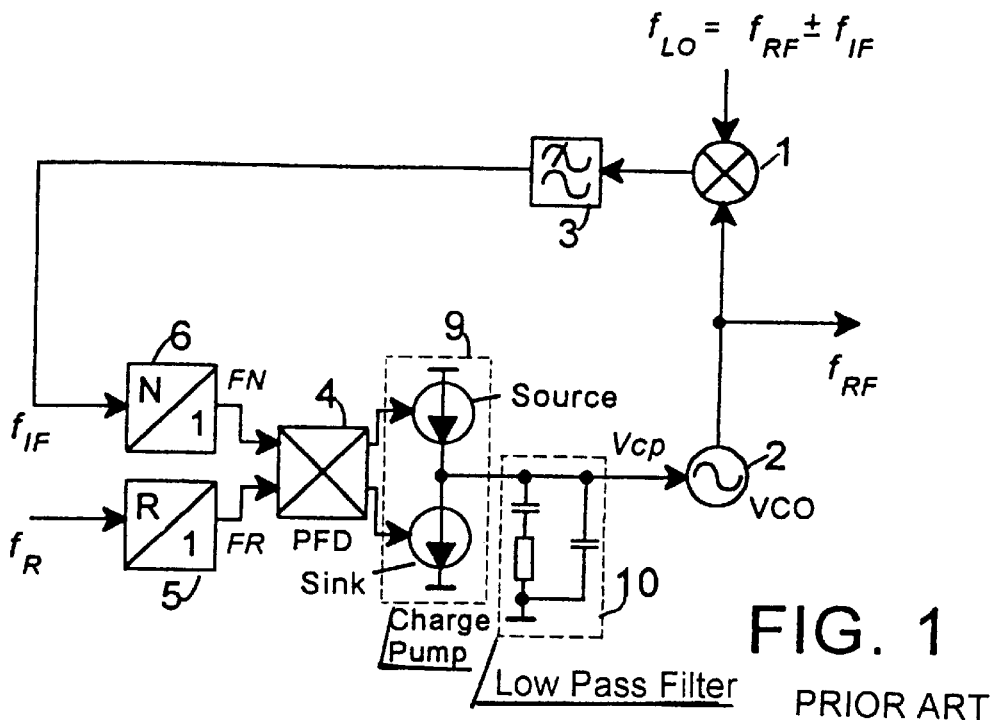
FIG. 1 is a diagrammatic, block circuit diagram of a known PLL frequency synthesizer with a loop mixer (MPLL)
Figure 2:
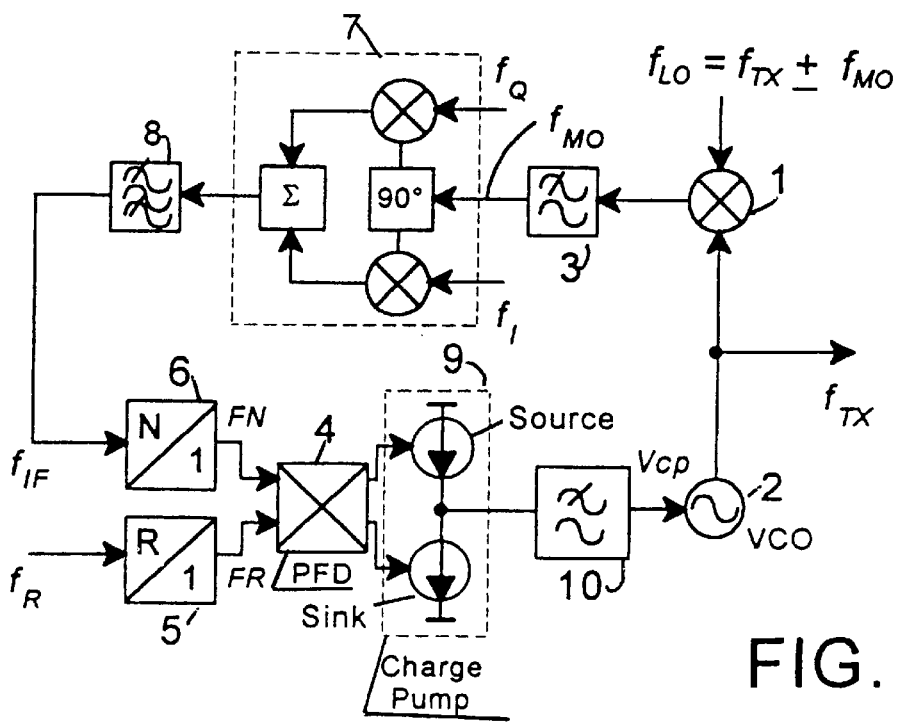
FIG. 2 is a block circuit diagram of a prior art upconversion modulation loop transmitter (UML-TX)

In all the figures of the drawing, sub-features and integral parts that correspond to one another bear the same reference symbol in each case. Referring now to the figures of the drawing in detail and first, particularly, to FIGS. 1 and 2 thereof, there are shown two examples of known RF circuits. The example shown in FIG. 1 is a PLL frequency synthesizer with a loop mixer (MPLL) 1, and the example illustrated in FIG. 2 is an upconversion modulation loop transmitter (UML-TX) receiving a local signal $f_{LO}$ and a reference signal $f_R$ being generated by an oscillator or frequency synthesizer.

The loop mixer 1 serves in both examples for downward mixing of an output frequency of a voltage-controlled oscillator (VCO) 2. Undesired mixing products of the loop mixer 1 are suppressed by a passive low-pass filter 3.

The phase-locked loop (PLL) has a phase-frequency detector (PFD) 4 which is fed, as one of two input signals, the reference signal having a frequency $f_R$ that is received by a frequency divider 5 with a divider ratio R/1. As a second input signal received by a frequency divider 6 with a divider ratio of N/1, a signal which is derived from an output signal of the voltage-controlled oscillator (VCO) 2 with a frequency $f_{RF}$ (FIG. 1) or a transmission frequency $f_{TX}$ (FIG. 2). The output signal of the VCO 2 and is subjected to mixing in the loop mixer 1 with a frequency synthesizer signal or a local oscillator signal $f_{LO}$ and, in the case of FIG. 2, also to modulation in a quadrature modulator 7 and filtering in a passive bandpass filter 8 and has a frequency $f_{IF}$ (before frequency division).

The output signals, present at two outputs, of the phase-frequency detector 4 are fed to two inputs of a charge pump 9. The charge pump 9 has two current sources (source and sink) and from whose output there is supplied a control voltage $V_{cp}$ which is provided for controlling the voltage-controlled oscillator 2 and is further fed through a passive loop low-pass filter 10.

The known PLLs of such type are mostly programmed with the aid of a bus, for example with a 3-line bus in their standby mode (only bus active). After programming, the control loops are switched from the standby mode into active mode. During the settling phase after being switched on, the PLL compels the voltage-controlled oscillator (VCO) 2 to follow the reference signal $f_R$ so that the phase angles and frequency positions of the two input signals at the phase-frequency detector 4 remain equal after lock-in is performed.

Both single-band and dual-band applications are presently being taken into account in developing PLLs. In the case of single-band cellular systems for GSM (Global System for Mobile Communications), PCN (Personal Communication Network) or PCS (Personal Communication System/Service), receivers and transmitters are configured with the PLLs only for an appropriate frequency band.

In dual-band systems, operating frequencies of the receivers and transmitters are switched over, for example, between GSM and PCN bands or between GSM and PCS bands, that is to say band changing is performed there. If the frequency of the local signal is selected to be $f_{LO}=f_{RF}+f_{IF}$ for GSM ($f_{RF}=900$ MHz) and to be $f_{LO}=f_{RF}-f_{IF}$ for PCN and PCS ($f_{RF}=1800$ MHz or 1900 MHz) for dual-band systems, the frequency lies between the two frequency bands between which the aim is to switch over.

Consequently, only a small frequency band range of the frequency synthesizer generating the local frequency $f_{LO}$ is required, thus easing the implementation of the frequency synthesizer with a low phase noise and short transient reaction. During the settling phase, the output frequency of the voltage-controlled oscillator (VCO) 2 is to be controlled so that a low frequency is produced at the output of the loop mixer 1. This required initial condition for a quick lock-in of the PLLs results for the below stated reasons.

In the case of MPLL and UML-TX:
1) the sensitivity of the N/1 divider 6 decreases at high frequencies;
2) the output power of the loop mixer 1 decreases at high frequencies; and
3) the passband attenuation of the low-pass filter 3 increases at high frequencies.

In addition, it holds in the case of the UML-TX that:
1) the sensitivity of the modulator 7 decreases at high frequencies;
2) the output power of the modulator 7 decreases at high frequencies; and
3) the passband attenuation of the bandpass filter 8 increases at high frequencies.

The initial condition mentioned above for a quick lock-in of the PLL can be fulfilled in the case of known PLL configurations by switching over a polarity of the phase-frequency detector (PFD) 4. Switching over the polarity is performed by software programming, for example by a 3-line bus.

In the case of a positive polarity at the output of the phase-frequency detector 4, the current source "source" in the charge pump 9 is switched on if a FN signal is in phase or in frequency with respect to a FR signal. With a negative polarity, the current source "sink" on the charge pump 9 is switched on. In order to fulfill the initial condition, the PLLs must be controlled as stated below.

1) The R/1 and N/1 dividers 5 and 6, the phase-frequency detector 4 and the charge pump 9 are firstly switched on, the voltage-controlled oscillator (VCO) 2 and the loop mixer 1 (and the modulator 7 in the UML-TX) remain switched off, and the reference signal with the frequency $f_R$ is present at the input of the R/1 divider 5, whereas no signal is present at the input of the N/1 divider 6.

2) The polarity of the phase-frequency detector 4 is switched over appropriately. Consequently, the output voltage of the charge pump 9 Vcp=Vcc (DC supply voltage) is achieved for GSM in the case of $f_{LO}=f_{RF}+f_{IF}$, and Vcp=gnd (0) is achieved for PCN and PCS in the case of $f_{LO}=f_{RF}-f_{IF}$.

3) The voltage-controlled oscillator (VCO) 2 and the loop mixer 1 (and the modulator 7 in the UML-TX) are switched on after precharging, and the entire PLL is now in the active mode and operates with a low initial frequency at the output of the loop mixer 1.

Since precharging is achieved by software programming, the term "software precharging" is used for this. FIG. 3 shows a simplified timing diagram of the software precharging without and with band changing. The period $t_{PCP}$ from switching over the polarity of the phase-frequency detector 4 up to reaching the appropriate output voltage is designated as precharging time.

The purpose of the signal pd is power-on (pd=high), and the purpose of the signal str is bus-enable. In FIG. 3, Vcc represents the DC supply voltage, Vcp the control voltage for the voltage-controlled oscillator (VCO), and gnd the ground potential.

The previous solution of software precharging has the following disadvantages.

1) There is a high power consumption in the case of precharging, because the R/1 and N/1 dividers 5 and 6, the phase-frequency detector 4 and the charge pump 9 must be switched on.

2) In the time frame and the time slots of TDMA (Time Division Multiple Access) cellular systems such as, for example, GSM or PCN, in which a time frame (4.616 ms) is divided into 8 time slots (577 µs), critical timing of the drive signals for the PLLs arises, because the circuits are switched on by software using two separate programming operations (precharging and active).

3) Precharging is required both for single-band and for dual-band applications without band changing, because the PLLs have a non-defined voltage Vcp when switched off, depending on the output frequency of the voltage-controlled oscillator (VCO).

In accordance with the invention, the PLL frequency synthesizer with the loop mixer (MPLL) 1 is again shown in FIG. 4 to represent a new precharging concept according to the invention for such PLLs. The PLL corresponds in large measure to that shown in FIG. 1, so that it is possible at this juncture to dispense with an explanation of the corresponding parts.

However, in the circuit according to FIG. 4, use is made, in addition, of a precharge pump 11 in parallel with the charge pump 9. Although only the MPLL phase-locked loop with the precharge pump 12 is shown in FIG. 4, the concept holds for all other PLLs, for example PLL and UML-TX (the basic block diagram being illustrated in FIG. 2).

The precharge pump 12 contains two current sources, a "source" and a "sink", and an inverter 11 that is driven by two signals pcp and pd. If, for example, pd=low, the PLL is in standby mode and only the precharge pump 12, which is driven by the signal pd via an inverter 13, is in active mode. The control signal pcp can be programmed with the aid of software or hardware. In the case of pcp=high, the current source "source" of the precharge pump 12 is switched on, and Vcp=Vcc is obtained as an output voltage for controlling the voltage-controlled oscillator (VCO) 2 for $f_{LO}=f_{RF}+f_{IF}$ (GSM)

In the case of pcp=low, the current source "sink" of the precharge pump 12 is switched on via the inverter 11. It then holds that Vcp=gnd (0) for $f_{LO}=f_{RF}-f_{IF}$ (PCN and PCS). After precharging, the PLL is switched over into an active mode, and the precharge pump 12 is switched over into standby mode (pd=high).

Figure 5:
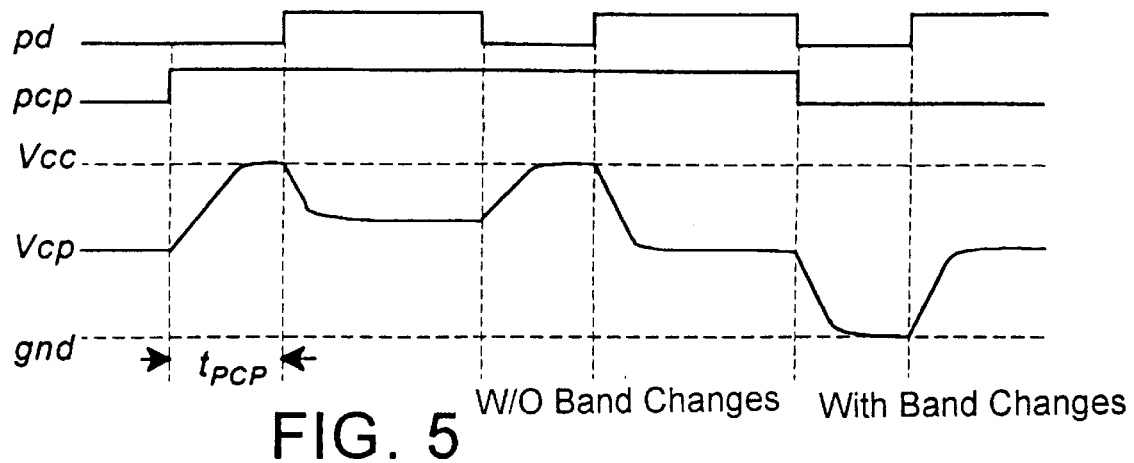
FIG. 5 is a graph of a timing diagram for the precharge pump of the circuit according to FIG. 4.

FIG. 5 shows a simplified timing diagram of the precharge pump 12 without and with band changing (single-band and dual-band applications, respectively). The control signals pcp and pd can be programmed with the aid of hardware or software. Owing to the elimination of the two separate programming operations with software, which are required in the case of the prior art solutions, the timing is not critical in this case for precharging. The period $t_{pcp}$ is denoted as a precharging time. In FIG. 5, Vcc represents the DC supply voltage, Vcp the control voltage for the voltage-controlled oscillator (VCO) 2, and gnd the frame potential.

The precharge pump 12 can be implemented with the aid of simple voltage-controlled or current-controlled current sources using bipolar and/or CMOS transistors, because only minor demands are made of the speed and accuracy by comparison with the charge pump 9 in the PLL. The precharging period is dependent on a magnitude of a current $I_{PCP}$ of the precharge pump 12 and of elements of the passive loop low-pass filter 10.

For this reason, the precharging period can be shortened by optimizing the precharge pump 12 and the passive loop low-pass filter 10. Since precharging takes place in the standby mode of the PLL, and can be implemented with simple circuits, the power consumption during precharging is substantially reduced.

For single-band applications, the output voltage Vcp can be fixed after precharging, or the precharging polarity can be fixed after initialization (first programming after power-on), that is to say no additional programming of precharging is required before the active mode. It is thereby possible to reduce the on-time of the PLLs. However, it is necessary for the precharging current $I_{PCP}$ to be reduced so that the entire power consumption in standby mode is acceptable.

Figure 6:
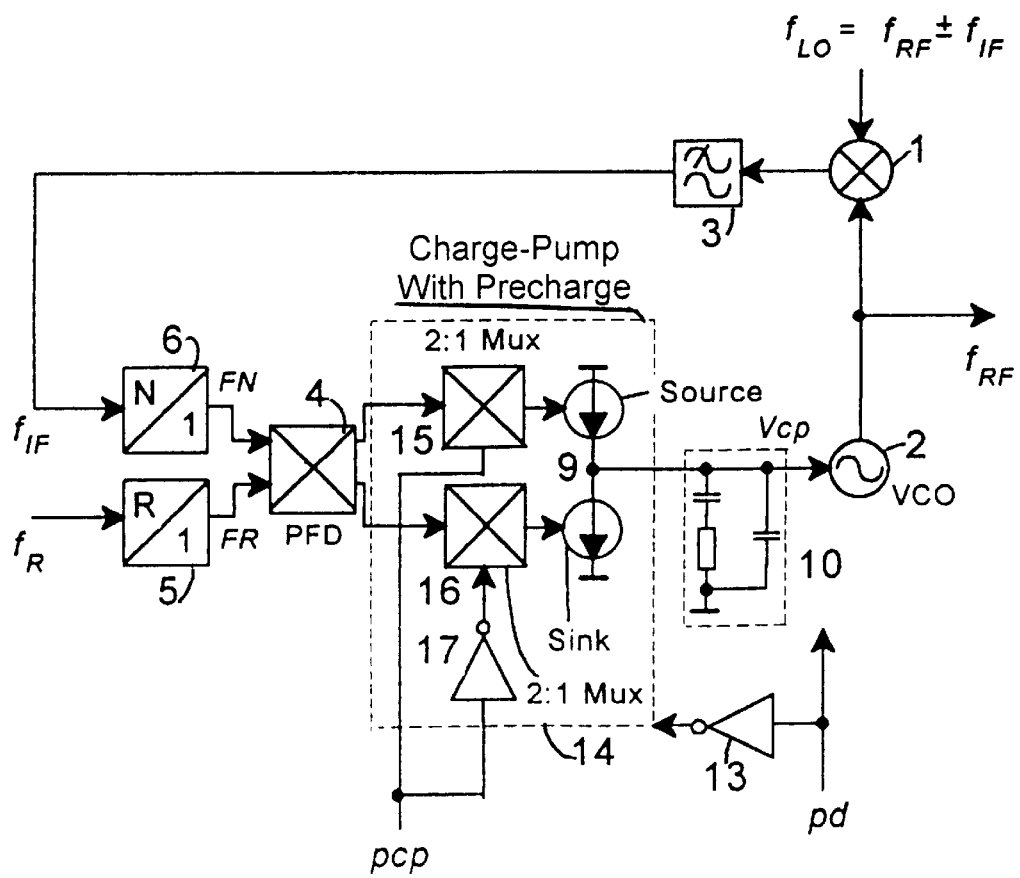
FIG. 6 is a circuit block diagram of the PLL frequency synthesizer with the loop mixer (MPLL) and the precharging configured in accordance with a variant of the invention.

According to an alternative configuration, the precharging function can also be implemented with the available charge pump 9 of the PLLs, as is shown in the block diagram of FIG. 6. The alternatively configured, novel precharging concept according to the invention is likewise shown in FIG. 6 with the aid of a PLL frequency synthesizer with the loop mixer 1 (MPLL) for such PLLs.

The PLL corresponds in large measure to that represented in FIG. 1, with the result that it is possible at this juncture also to dispense with an explanation of the corresponding parts. However, in a specially configured charge pump device 14 with precharging function, use is made of two 2:1 multiplexers (Mux) 15 and 16 upstream of the charge pump 9 so that the outputs of the phase-frequency detector (PFD) 4 are connected to the control signal pcp or to an inverted control signal pcp, which is inverted by inverter 17, so that the charge pump 9 with the precharging function can remain in active mode in the standby mode of the PLLs.

Since the charge pump 9 of the PLLs is normally configured with more accurate and faster circuit techniques than the precharge pump 12 according to FIG. 4, the power consumption of the alternative concept according to FIG. 6 is higher during precharging than in the case of precharging according to the first-described configuration in accordance with FIG. 4.

The two novel precharging configurations explained with the aid of FIGS. 4 and 6 have the below listed advantages by comparison with the prior art software precharging.

1) There is a low power consumption during precharging, since only the precharge pump 12 in FIG. 4, or the charge pump device 14 with precharging included therein in FIG. 6, is in the active mode.

2) The timing for precharging is not critical, because of the elimination of the two separate software programming operations.

3) For single-band and dual-band applications without band changing, the programming operation for precharging is eliminated, as a result of which the PLLs are switched on quickly.

We claim:

1. A phase-locked loop for radio-frequency signals, comprising:

a voltage controlled oscillator generating an output signal;

a loop mixer receiving and mixing said output signal from said voltage controlled oscillator with a local oscillator signal and outputting a mixed signal;

a phase-frequency detector receiving a reference signal and said mixed signal, and outputting charge pump signals;

a charge pump circuit generating a control voltage and containing a charge pump receiving said charge pump signals from said phase-frequency detector and a precharge pump supplementing said charge pump, said precharge pump receiving and driven by logic control signals including a first logic control signal and a second logic control signal, said first logic control signal ensuring during precharging that the phase-locked loop is in a standby mode and that only said precharge pump is in an active mode, and, conversely, after said precharging the phase-locked loop is in an active mode and said precharge pump is in a standby mode, and said second logic control signal ensuring that said precharge pump applies said control voltage required for setting an initial state of said voltage-controlled oscillator to allow a fast lock-in of said voltage-controlled oscillator during a settling phase, said control voltage to be fed to said voltage-controlled oscillator being fixed after said precharging and a precharging polarity being fixed after initialization for single-band applications; and a passive loop low-pass filter receiving said control voltage and outputting a filtered control voltage received by and controlling said voltage-control oscillator.

2. The phase-locked loop according to claim 1, wherein said logic control signals are programmed by hardware.

3. The phase-locked loop according to claim 1, wherein said logic control signals are programmed by software.

4. The phase-locked loop according to claim 1, wherein said precharge pump contains two voltage-controlled current sources having at least one of bipolar and CMOS transistors.

5. The phase-locked loop according to claim 1, wherein said precharge pump contains two current-controlled current sources having at least one of bipolar and CMOS transistors.

6. The phase-locked loop according to claim 1, wherein said precharge pump and said passive loop low-pass filter configured to be optimized with respect to their power consumption so that a shortened precharge period results.

7. The phase-locked loop according to claim 1, including:

a first frequency divider receiving said mixed signal and outputting a divided mixed signal received by said phase-frequency detector; and a second frequency divider receiving said reference signal and outputting a divided reference signal received by said phase-frequency detector.

8. The phase-locked loop according to claim 7, including a modulator receiving said mixed signal and outputting a modulated mixed signal received by said first frequency divider.

9. The phase-locked loop according to claim 1, wherein an initial programming has occurred after power-on with a result that no additional programming of said precharging is required before switching to said active mode, and in that a precharging current IPCP is reduced such that a total power consumption in said standby mode is low.

10. A phase-locked loop for radio-frequency signals, comprising:

a voltage controlled oscillator generating an output signal;

a loop mixer receiving and mixing said output signal from said voltage controlled oscillator with a local oscillator signal and outputting a mixed signal;

a phase-frequency detector receiving a reference signal and said mixed signal, said phase-frequency detector having two outputs outputting charge pump signals;

a charge pump device having an inverter, two inputs receiving said charge pump signals from said phase-frequency detector, and an output outputting a control voltage, said charge pump performing a precharging function and having 2:1 multiplexers disposed between each of said two outputs of said phase-frequency detector and each of two other inputs of said charge pump, said charge pump receiving and driven by logic control signals including a first logic control signal and a second logic control signal for carrying out said precharging function, said first logic control signal ensuring that during precharging the phase-locked loop is in a standby mode and only said charge pump with said precharging function is in an active mode and the phase-locked loop is in an active mode after said precharging, and said second logic control signal received by one of said 2:1 multiplexers directly and to another of said 2:1 multiplexers via said inverter in order that said charge pump signals of said phase-frequency detector are combined with the second logic control signal and with said second logic control signal inverted with respect thereto, to ensure that said charge pump applies said control voltage required for an initial state of said voltage-controlled oscillator to allow a fast lock-in of said voltage-controlled oscillator during a settling phase; and a passive loop low-pass filter receiving said control voltage and outputting a filtered control voltage received by and controlling said voltage-control oscillator.

11. The phase-locked loop according to claim 10, wherein said loop mixer, said charge pump, said passive loop low pass filter, said voltage control oscillator, and said phase-frequency detector are formed using integrated circuit technology.

* * * * *